(12) United States Patent
Cai

(10) Patent No.: US 8,349,717 B2
(45) Date of Patent: Jan. 8, 2013

(54) HIGH VOLTAGE LDMOS

(75) Inventor: Jun Cai, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 389 days.

(21) Appl. No.: 12/035,758

(22) Filed: Feb. 22, 2008

(65) Prior Publication Data

US 2008/0138954 A1 Jun. 12, 2008

Related U.S. Application Data

(62) Division of application No. 11/454,562, filed on Jun. 16, 2006, now Pat. No. 7,355,224.

(51) Int. Cl.
*H01L 21/22* (2006.01)

(52) U.S. Cl. ........ 438/549; 438/285; 438/700; 438/702; 257/E21.417

(58) Field of Classification Search .......... 438/702, 438/700, 549, 285; 257/E21.417
See application file for complete search history.

(56) References Cited

U.S. PATENT DOCUMENTS

| | | | | |
|---|---|---|---|---|
| 4,666,556 A | * | 5/1987 | Fulton et al. | 438/431 |
| 5,124,764 A | * | 6/1992 | Mori | 257/334 |
| 6,297,534 B1 | * | 10/2001 | Kawaguchi et al. | 257/341 |
| 6,979,875 B2 | * | 12/2005 | Kwon et al. | 257/492 |
| 2002/0088990 A1 | * | 7/2002 | Iwamoto et al. | 257/136 |
| 2006/0220156 A1 | * | 10/2006 | Saito et al. | 257/409 |

OTHER PUBLICATIONS

Kawaguchi et al. "Predicted Electrical Characteristics of 4500 V Super Multi-Resurf MOSFETs," IEEE, Power Semiconductor Devices and ICs, p. 95-98, 1999.*

* cited by examiner

*Primary Examiner* — Matthew Reames
(74) *Attorney, Agent, or Firm* — Hiscock & Barclay, LLP

(57) ABSTRACT

A semiconductor device, such as a LDMOS device, comprising: a semiconductor substrate; a drain region in the semiconductor substrate; a source region in the semiconductor substrate laterally spaced from the drain region; and a drift region in the semiconductor substrate between the drain region and the source region. A gate is operatively coupled to the source region and is located offset from the drain region on a side of the source region opposite from the drain region. When the device is in an on state, current tends to flow deeper into the drift region to the offset gate, rather than near the device surface. The drift region preferably includes at least first and second stacked JFETs. The first and second stacked JFETs include first, second and third layers of a first conductivity type, a fourth layer intermediate the first and second layers including alternating pillars of the first conductivity type and of a second conductivity type extending between the source and drain regions; and a fifth layer intermediate the second and third layers, including alternating pillars of the first and second conductivity types extending between the source and drain regions.

15 Claims, 15 Drawing Sheets

US 8,349,717 B2

HIGH VOLTAGE LDMOS

CROSS REFERENCE TO RELATED APPLICATIONS

This application is a divisional of U.S. patent application Ser. No. 11/454,562 filed Jun. 16, 2006, which application is hereby incorporated by reference.

FIELD OF THE INVENTION

This invention relates in general to semiconductor devices and more particularly to an improved high voltage Lateral Double-Diffused Metal Oxide Semiconductor (LDMOS) device and method of making such a device.

BACKGROUND OF THE INVENTION

In general, high-voltage integrated circuits in which at least one high-voltage transistor is arranged on the same chip together with low voltage circuits are widely used in a variety of electrical applications. In these circuits, a LDMOS transistor is an important high voltage device. FIG. 1 is a diagrammatic view of a typical LDMOS device showing a flux tube and impact ionization zones of the device. As shown, LDMOS device 10 includes a P substrate 12, an nwell layer 14, n+ drain 16, p body 18, n+ source 20 diffused in p body 18, P+ tap 19, source contact 22, and drain contact 24. A gate 26 overlies source 20 and p body 18 and is located between source 20 and drain 16. A flux tube 28 extends between drain 16 and source 20 and forms a surface channel under gate 26. Impact ionization zones 30 and 32 are located along tube 28 at drain 16 and at p body 18 at areas 34 and 36, respectively, of the drift region. FIG. 2 is a graphical illustration of the surface E-field for the device of FIG. 1. The surface E-field 38 has peaks 40 and 42 of drift region ND and a plateau 44 between peaks 40, 42.

In order improve a high voltage LDMOS device, it is desirable to cut the surface E-field peaks and to lower the surface E-field. As an example, in order to meet the global requirements of a high voltage device where VRMS can be 110V to 277V, the Vpeak can be 186V to 470v and a voltage spike can be 336V to 620V, the device desirably should have a breakdown voltage of 700V.

U.S. Pat. No. 6,097,063, issued Apr. 1, 2000, inventor Fujihira, is of interest and discloses a semiconductor device which has a drift region in which current flows if it is in the on mode and which is depleted if it is in the off mode. The drift region is formed as a structure having a plurality of first conductive type drift regions and a plurality of a second conductive type compartment regions in which each of the compartment regions is positioned among the adjacent drift regions in parallel to make p-n junctions respectively. The disclosed device is disadvantageous in the number of process steps required to make the device.

There is thus a need for a high voltage LDMOS device which has reduced surface E-field and E-field peaks, a reduced on resistance, reduced device size, and a simplified process for making the device.

SUMMARY OF THE INVENTION

According to the present invention, there is provided a fulfillment of the needs and a solution to the problems discussed above.

According to a feature of the present invention, there is provided:

a semiconductor device comprising:
a semiconductor substrate;
a drain region in said semiconductor substrate;
a source region in said semiconductor substrate laterally spaced from said drain region;
a drift region in said semiconductor substrate between said drain region and said source region; and
a gate operatively coupled to said source region located offset from said drain region on a side of said source region opposite from said drain region;
wherein, when said device is in an on state, current tends to flow deeper into said drift region to said offset gate, rather than near the device surface.

According to another feature of the present invention there is provided:

a semiconductor device comprising:
a semiconductor substrate;
a drain region in said semiconductor substrate;
a source region in said semiconductor substrate laterally spaced from said drain region;
a drift region in said semiconductor substrate between said drain region and said source region;
wherein said drift region includes at least first and second stacked junction field effect transistors (JFETs).

According to a further feature of the present invention there is provided
semiconductor device comprising:
a semiconductor substrate;
a drift region in said semiconductor substrate;
wherein said drift region includes at least first and second stacked junction field effect transistors (JFETs).

According to a still further feature of the present invention there is provided:

a method of making a semiconductor device having a drift region comprising:
providing a semiconductor substrate of a first conductivity type;
producing a buried well of a second conductivity type in said semiconductor substrate;
producing a shallow buried layer of a first conductivity type inside said buried well;
producing an epitaxial layer of a second conductivity type on said buried well;
etching spaced, parallel trenches in said epitaxial layer and buried well; wherein the width of said trenches is equal or less than the width of the width of the regions between said etched trenches;
filling said trenches by segment epitaxial refill with material of said first conductivity type, resulting in alternating pillars of said first and second conductivity type; and
producing a top layer of a first conductivity type on said epitaxial layer.

According to another feature of the present invention there is provided
a method of making a semiconductor device having a drift region comprising:
providing a semiconductor substrate of a first conductivity type;
producing a buried well of a second conductivity type in said semiconductor substrate;
producing a shallow buried layer of a first conductivity type inside said buried well.
producing an epitaxial layer of a second conductivity type on said buried well;
etching spaced, parallel trenches in said epitaxial layer and buried well;

wherein the width of said trenches is equal or less than the width of the width of the regions between said etched trenches;

filling said trenches by oxide/Si refill in which a trench side-wall thermal oxide layer has a Si of said first conductivity type refill; and producing a top layer of a first conductivity type on said epitaxial layer.

According to another feature of the present invention there is provided:

a method of making a semiconductor device having a drift region, comprising:

providing a semiconductor substrate of a first conductivity type;

producing a buried well of a second conductivity type in said semiconductor substrate;

producing a shallow buried layer of a first conductivity type inside said buried well;

producing an epitaxial layer of a first conductivity type on said buried well;

producing two wells of a second conductivity type in said epitaxial layer located in source and drain areas;

etching spaced, parallel trenches in said epitaxial layer and buried well, wherein the width of said trenches is equal or larger than the width of the width of the regions between said etched trenches;

filling said trenches by segment epitaxial refill with material of said second conductivity type, resulting in alternating pillars of said first and second conductivity type; wherein the alternating pillars of said first and second conductivity type are linked with the two wells of said second conductivity type located in said source and drain areas; and producing a top layer of a first conductivity type on said epitaxial layer.

According to another feature of the present invention there is provided:

a method of making a semiconductor device having a drift region, comprising:

providing a semiconductor substrate of a first conductivity type;

producing a buried well of a second conductivity type in said semiconductor substrate;

producing a shallow buried layer of a first conductivity type inside said buried well;

producing an epitaxial layer of a first conductivity type on said buried well;

producing two wells of a second conductivity type in said epitaxial layer located in source and drain areas;

etching spaced, parallel trenches in said epitaxial layer and buried well, wherein the width of said trenches is equal or larger than the width of the width of the regions between said etched trenches;

filling said trenches by oxide/Si refill in which a trench sidewall thermal oxide layer has a Si of said second conductivity type refill, and the alternating pillars of said first and second conductivity types are linked with the two wells of said second conductivity type located in said source and drain areas.

DESCRIPTION OF THE INVENTION

Figure 1:
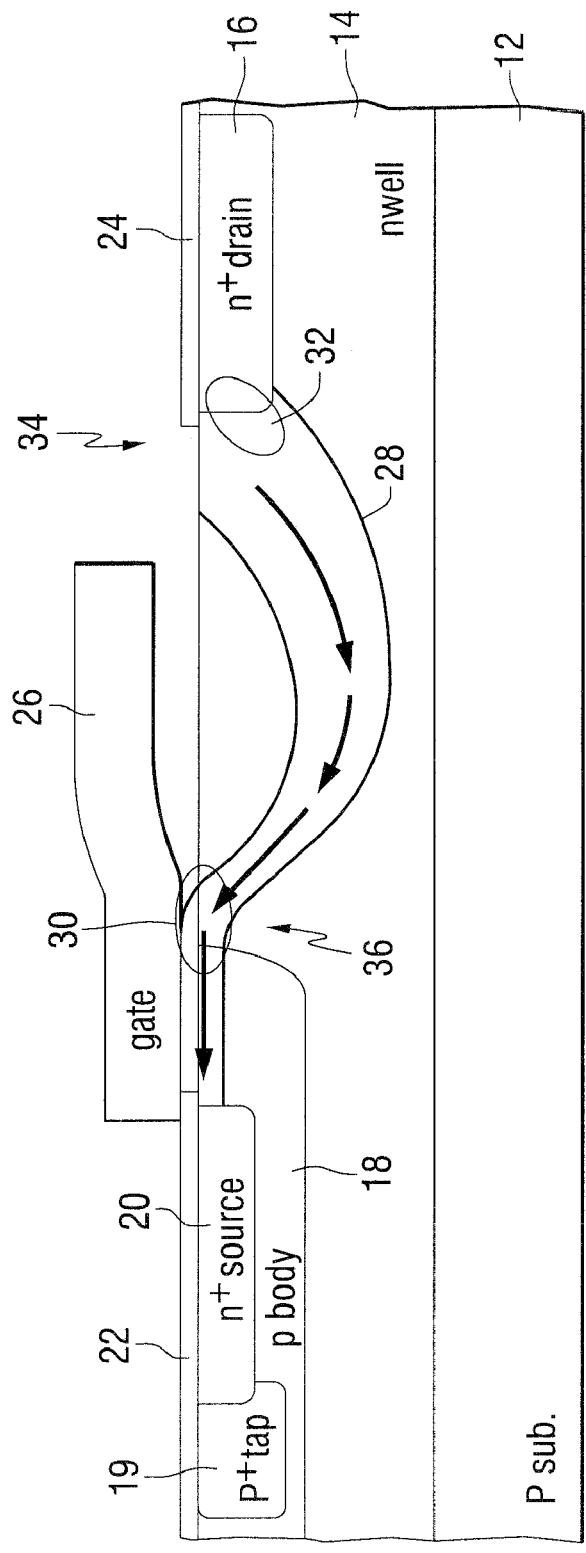
FIG. 1 is a diagrammatic view showing a known high voltage LDMOS device.
Figure 2:
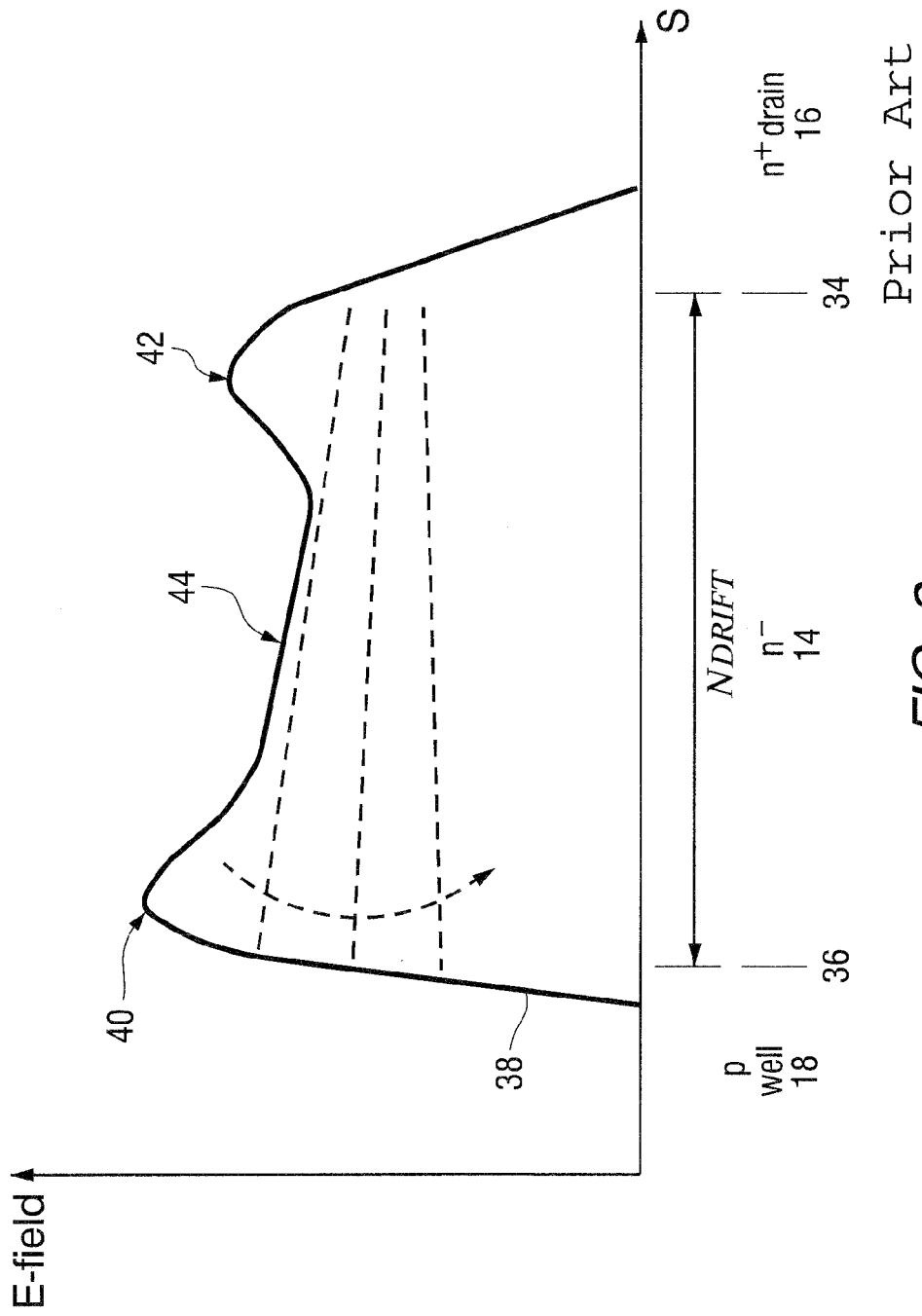
FIG. 2 is a graphical view of the surface E-field of the device of FIG. 1.
Figure 3:
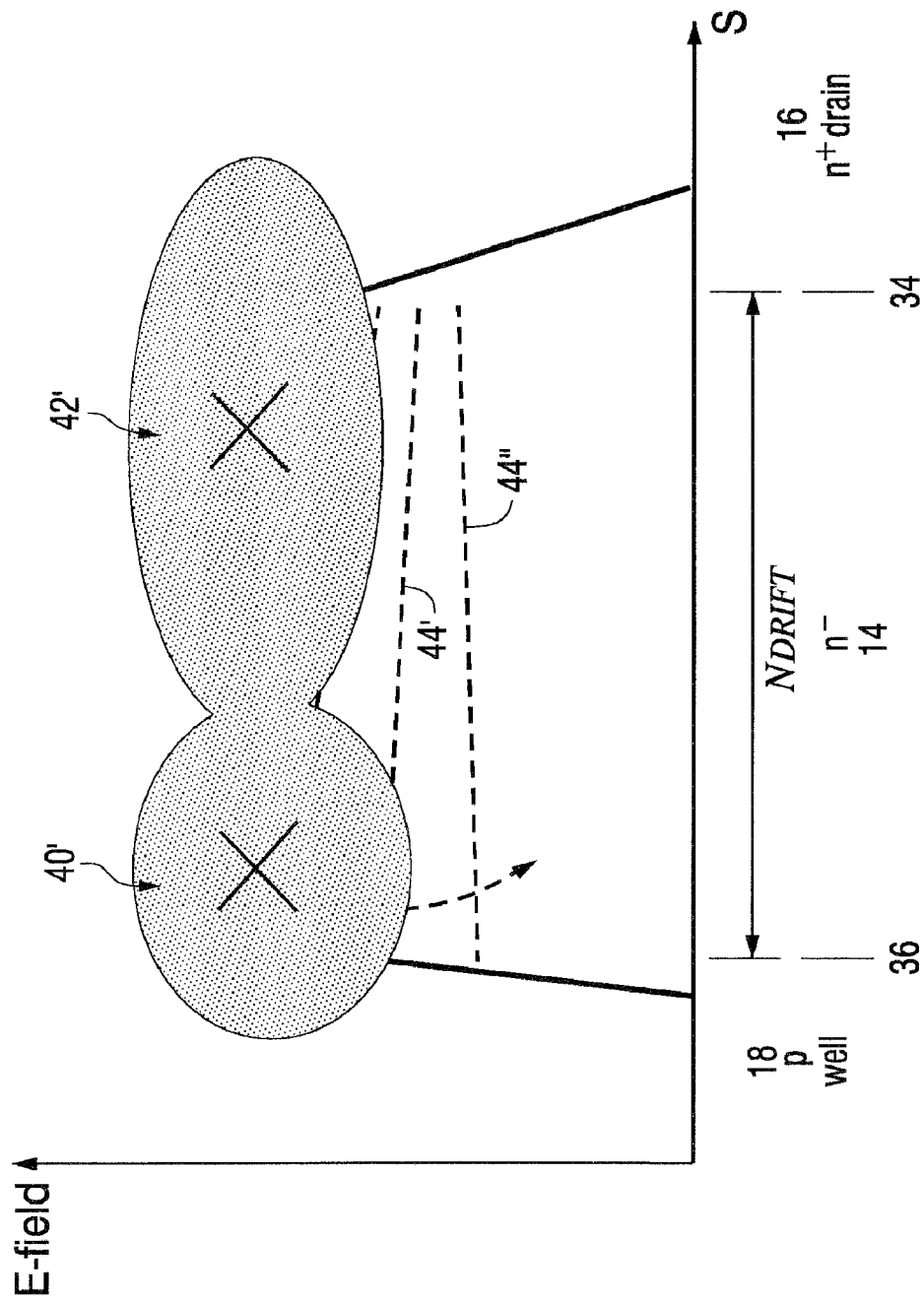
FIG. 3 is a graphical, diagrammatic view useful in explaining the present invention.

According to the present invention, an improved high voltage LDMOS device is provided in which the surface E-field peaks and the surface E-field of the device are reduced. FIG. 3 is a diagrammatic view illustrating these effects. As shown, FIG. 3 is similar to FIG. 2, but peaks 40 and 42 have been crossed out at 40' and 42', and the E-field plateau has been lowered at 44' or 44". These E-field effects can be attained by removing the surface channel or by removing the surface channel facing to the drain side at peak 40 and by increasing the junction depletion width to drop the E-field and by making the drift region easily depleted at the off-state high voltage. As a consequence, the breakdown voltage will also increase.

Figure 4A:
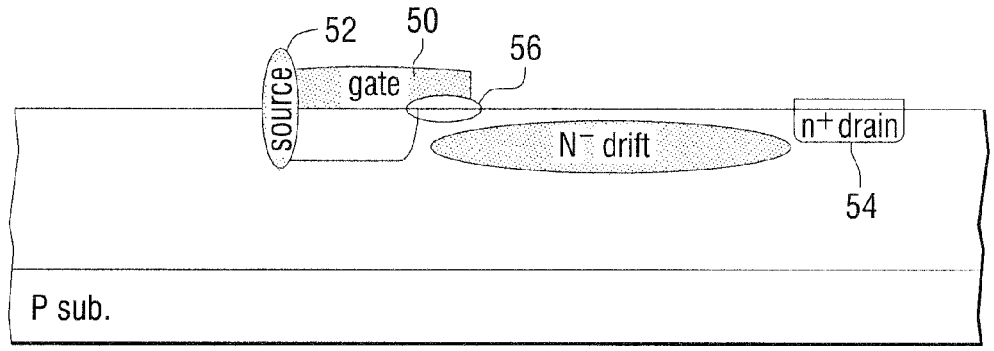
FIGS. 4A, 4B, and 4C are diagrammatic views respectively of a known gate structure, and of two gate structures according to embodiments of the present invention.
Figure 4B:
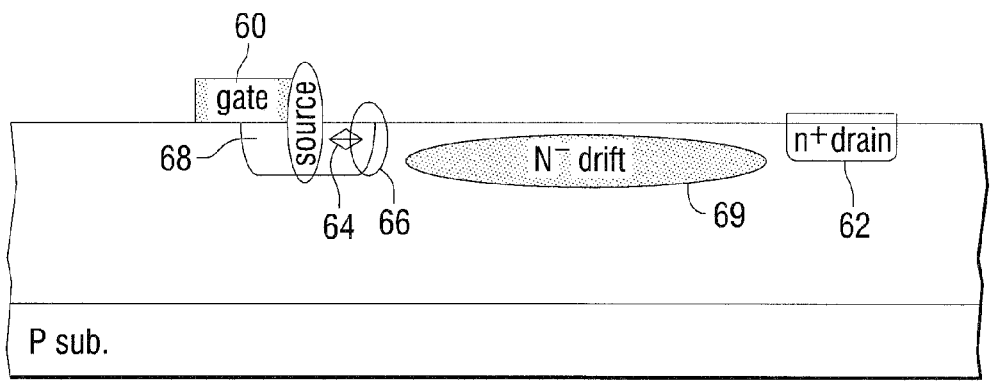
Figure 4C:
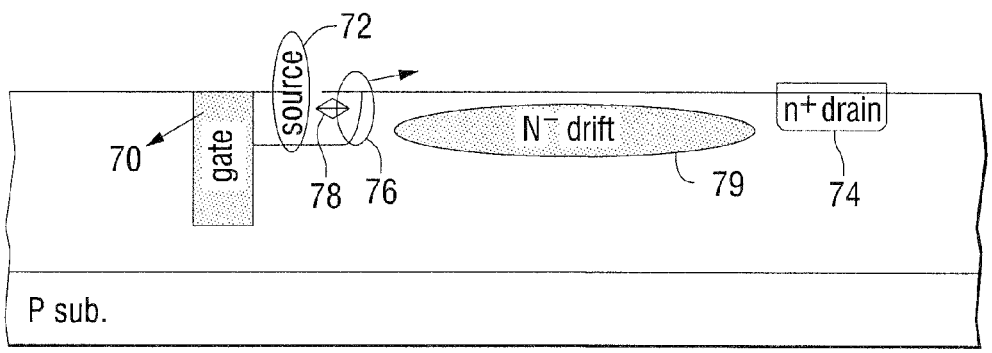

According to one aspect of the invention, the gate of the high voltage LDMOS device is offset from a location between the source and the drain to a location on the other side of the source away from the drain. This aspect is illustrated in FIGS. 4A-4C. As illustrated in FIG. 4A, a standard plane gate 50 is located between source 52 and drain 54. The surface channel edge 56 on the drain side is a weak point for the LDMOS device due to a surface E-field peak. This is especially true for a device having a thin gate oxide with n/p pillar super junction located in the gate oxide area due to the rough surface topography. FIG. 4B shows one embodiment of the present invention where the plane gate 60 has been offset away from drain 62 to the other side of source 64. The complicated high voltage LDMOS design of FIG. 4A has been changed to a relatively simple HV PIN diode design at area 66. In this embodiment, the channel region current flow has been controlled to make the drain current flow deeply into the semiconductor bulk, thus reducing surface electric field. The surface E-field is reduced because there is no surface channel and surface gate oxide facing the n+ drain 62. A large device SOA (Safe Operating Area) is also obtained because the P-body (P-well) 68 facing n+ drain 62 effectively collects hole current when the device is in the on state.

FIG. 4C shows another embodiment of the present invention wherein offset trench gate 70 is located on the side of source 72 away from that facing drain 74. As with the embodiment of FIG. 4B, the high field region of the device of FIG.

4A, has been changed to a p-n junction area 76 and the drain current flows deeply into the semiconductor bulk. As will be described later, the small width of Pwell 68 of the embodiment of FIG. 4B and of Pwell 78 of the embodiment of FIG. 4C can handle a high breakdown voltage based on a 4-D stacked JFET control drift region 69, 79.

Figure 5:
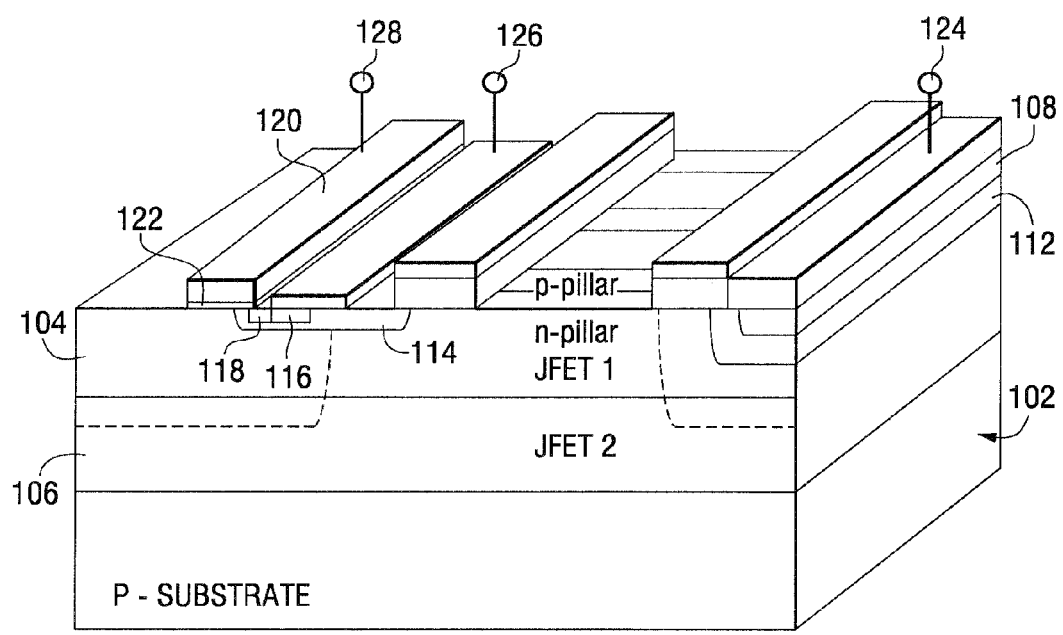
FIG. 5 is a perspective, diagrammatic view of an embodiment of the present invention.
Figure 6:
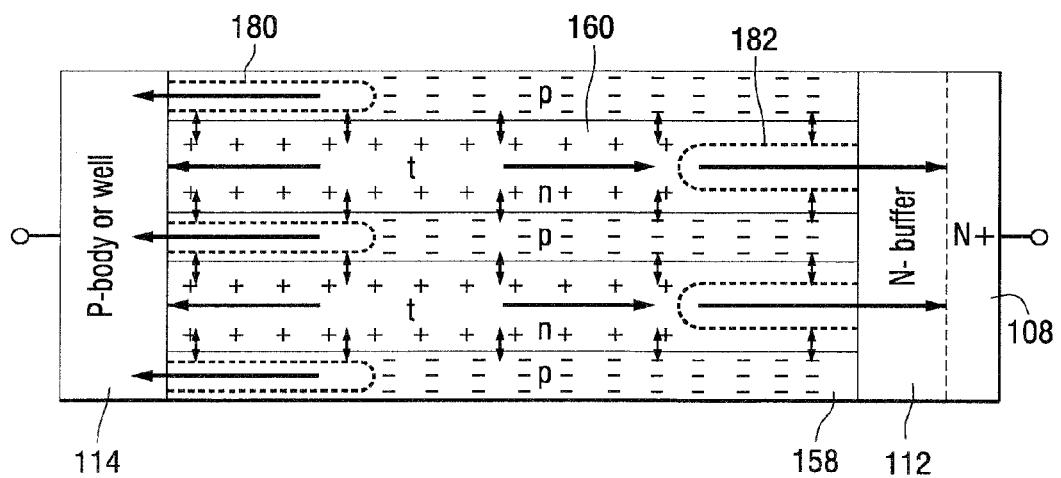
FIG. 6 is a top, sectional, plan, diagrammatic view of a portion of the embodiment of FIG. 5.
Figure 7:
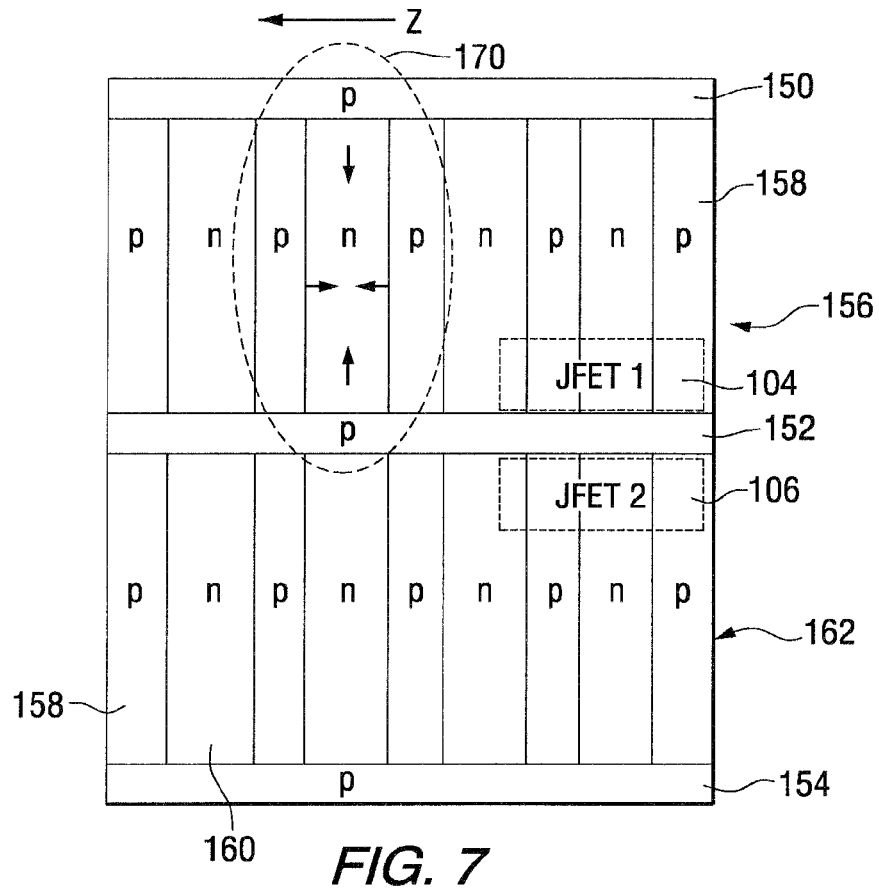
FIG. 7 is a front, sectional, elevational, diagrammatic view of a portion of the embodiment of FIG. 5.
Figure 8:
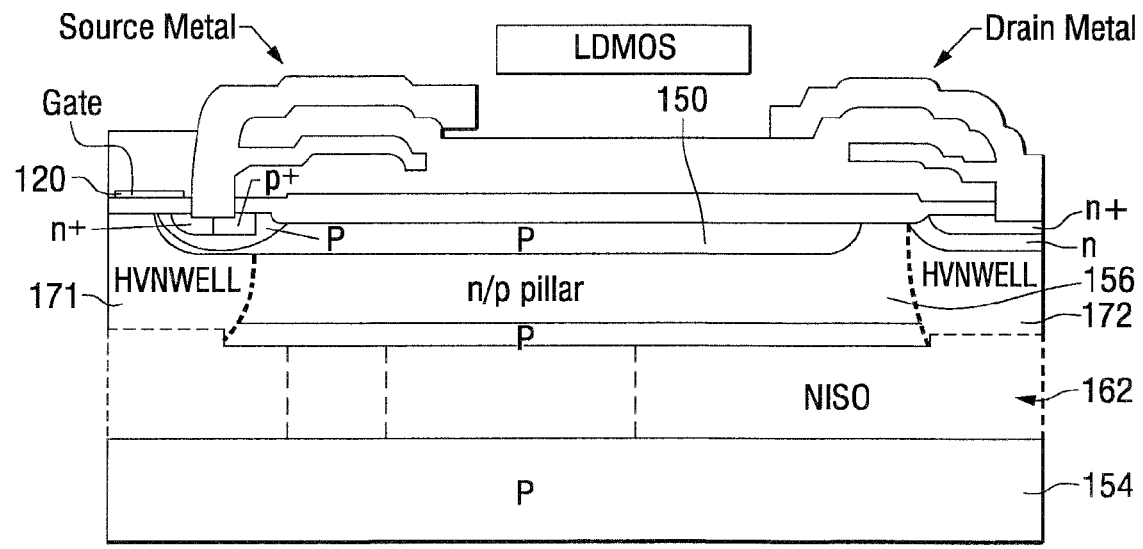
FIG. 8 is a side, elevational, sectional, diagrammatic view on a larger scale of the embodiment of FIG. 5.

Referring now to FIGS. 5-8, there is shown in greater detail an embodiment of the present invention. As shown in FIG. 5, high voltage LDMOS semiconductor device 100 includes a P substrate 102, stacked JFETs (Junction Field Effect Transistors) 104 and 106, n+ drain region 108, n-well 112, p-well 114, n+ source 118, p+ tap 116, offset plane gate 120, thin oxide layer 122, drain contact 124, source contact 126, and gate contact 128. FIGS. 6 and 7 show in greater detail portions of the structure of the stacked JFETs with 4-direction extension (4D) JFET control which results in high breakdown voltage (BV) and low on resistance Rdson for the device. FIG. 7 is a cross-sectional view of a portion of the stacked JFETs which include first, second, and third layers 150, 152, and 154, respectively, of p-type conductivity material. A fourth layer 156 is provided between layers 150 and 152 and includes pillars 158 of p-type conductivity material alternating with pillars 160 of n-type conductivity material. A fifth layer 162 is provided between layers 152 and 154 that also includes alternating pillars 158 and 160. FIG. 6 is a top, plan sectional view showing a portion of the pillar structure of FIG. 6. As shown, pillars 158, 160 extend between n+ well region 112/n+ drain region 108 and p-body or well 114 with source 116. FIG. 8 shows the JFETs extending between HV NWELLs 171 and 172.

According to another aspect of the invention, an unbalanced doping concentration is provided with the p-type pillars having a relatively high doping concentration and the n-type pillars having a relatively low doping concentration (but still much greater than normal n-drift doping) in order to increase the n-drift depletion region width based on JFET control. Additionally, the p pillars are made relatively narrower and the n pillars relatively wider. Thus, the wider n pillars have reduced sensitivity for pillar width variation due to process variation.

Because the n/p pillars are not located at the thin gate oxide region, the gate oxide sensitivity for the top topography of the super junction areas will be reduced. In addition, with the offset gate structure, the n+ source is screened by the p-well resulting in a large device SOA area.

FIG. 7 illustrates the 4-D depletion extensions by JFET control in both the lateral and vertical directions at the dashed line region 170. FIG. 6 illustrates the depletion region extensions in the lateral direction in more detail at the dashed line regions 180 at the source ends of p pillars 158 and at the dashed line regions 182 at the drain ends of n pillars 160. In the off state of the device, a reverse-biased voltage across the source/drain causes the n-drift and p-drift regions to be depleted in both the vertical and lateral directions under JFET control; a depletion region pinch-off happens in the drift region, which supports the device breakdown, and the large depletion region width t supports high drain to source breakdown voltage. In the on-state of the device: the increase in n-drift doping reduces the on-state resistance of the device, therefore improving the device current handling capability; the on-state resistance can be adjusted by different kinds of n-drift and p-drift layout configurations; and the on-state resistance can be continuously reduced by the 4-D stacked drift.

Figure 9:
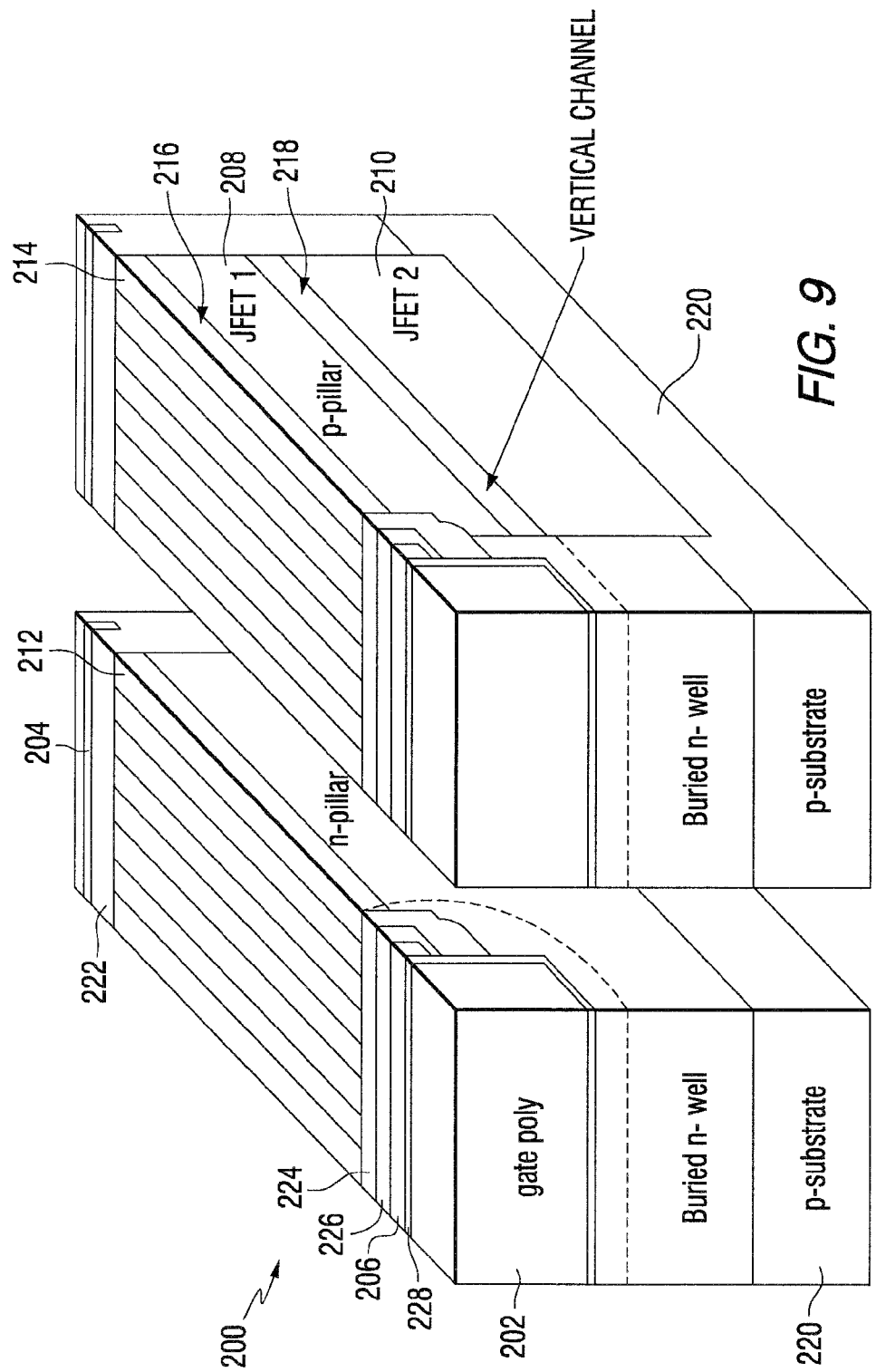
FIG. 9 is a perspective, diagrammatic view of another embodiment of the present invention.

Referring now to FIG. 9, there is shown an offset trench gate embodiment of the present invention. As shown, trench gate LDMOS device 200 includes a trench gate 202 which is offset from n+ drain region 204 by its location on the side of n+ source region 206 opposite from drain region 204. Trench gate 202 can be a polysilicon or other appropriate conductive material. Trench gate device 200 is otherwise similar in construction to the embodiment of FIG. 5 and includes stacked JFETs 208 and 210 with alternating n/p pillars 212, 214 sandwiched between top p layer 216, intermediate p layer 218, and substrate p layer 220. N+ drain region 204 is diffused in n-well 222, and n+ source region 206 is diffused in p-well 224, which also has p+ tap region 226. A thin oxide layer 228 separates trench gate 202 from n+ source 206 and buried n-well 230.

Figure 10A:
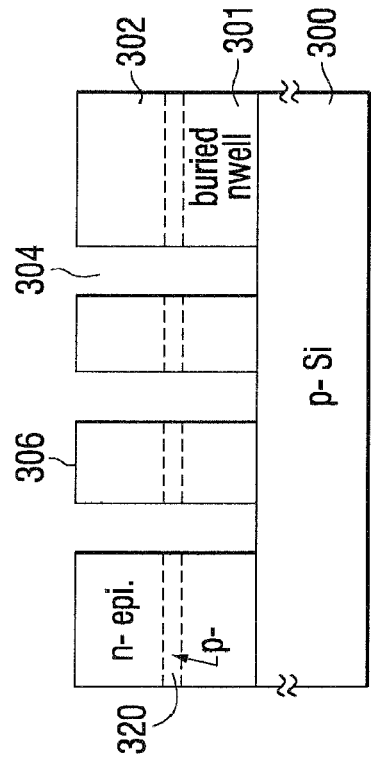
FIGS. 10A-10D are schematic views illustrating a method for forming n/p pillars according to the present invention.
Figure 10B:
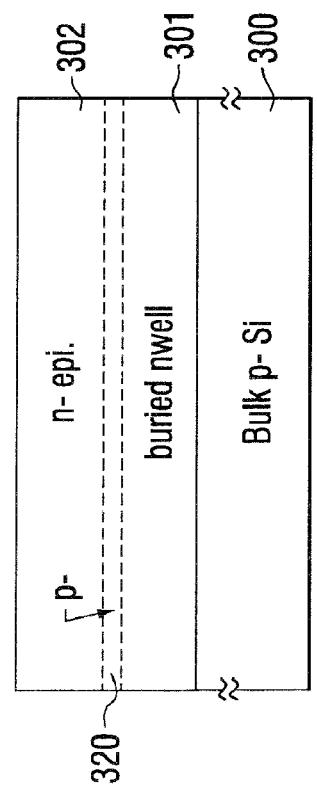
Figure 10C:
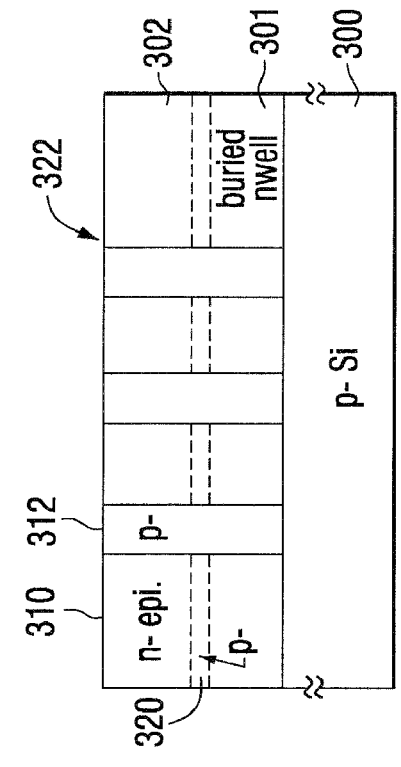
Figure 10D:
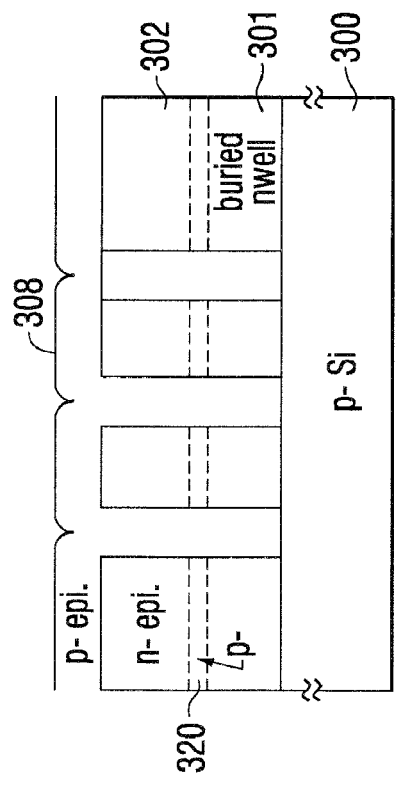

Referring now to FIGS. 10A-10D, there will be described a method of forming the nip pillar structure of the JFET region according to another aspect of the present invention. In general, the method comprises: providing a bulk p– silicon layer 300, producing a buried nwell layer 301, making a p– layer 320 in layer 301 and growing an n-epitaxial layer (p-epitaxial layer is an option) 302 on layer 301 (FIG. 10A); etching spaced parallel trenches 304 in layer 2 layers 301 and 302, the width of the trenches 304 being equal or less than the width of the regions 306 between trenches 304 (the width of the trenches 304 being equal or larger than the width of the regions 306 between trenches 304 for p-epitaxial option) (FIG. 10B); filling trenches 304 by segment epitaxial refill with p material 308 (n material corresponding to p– epitaxial as an option) (FIG. 10C); resulting in alternating n pillars 310 and p pillars 312 (FIG. 10D). A top layer 322 of p type is then produced. Segment epitaxial refill is carried out by intrinsic epitaxial refill and in-situ doped epitaxial refill, or different level in-situ doped epitaxial refills. The in-situ doped epitaxial layer with needed doping concentration is provided for p-n pillars charge balance. The intrinsic epitaxial layer with un-doped material is provided for process adjustment and also to support some doped layer lateral diffusion for higher breakdown voltage. Trenches 304 can also be filled with oxide/Si refill in which a trench side-wall thermal oxide layer has a Si refill. The sidewall oxide is used to prevent lateral diffusion between p pillars and n pillars in the device fabrication. In this case, there is an electric field through the trench side wall oxide by a capacitor (n pillars/oxide/p pillars), instead of the diode (n pillars/p pillars), to make the n pillars depleted in the device off-state for high device breakdown voltage. The refill materials could be Si, polysilicon, SiC and also high electron mobility materials, such as SiGe.

Referring now to FIGS. 11A-15E, other embodiments of the present invention are shown.

Figure 11A:
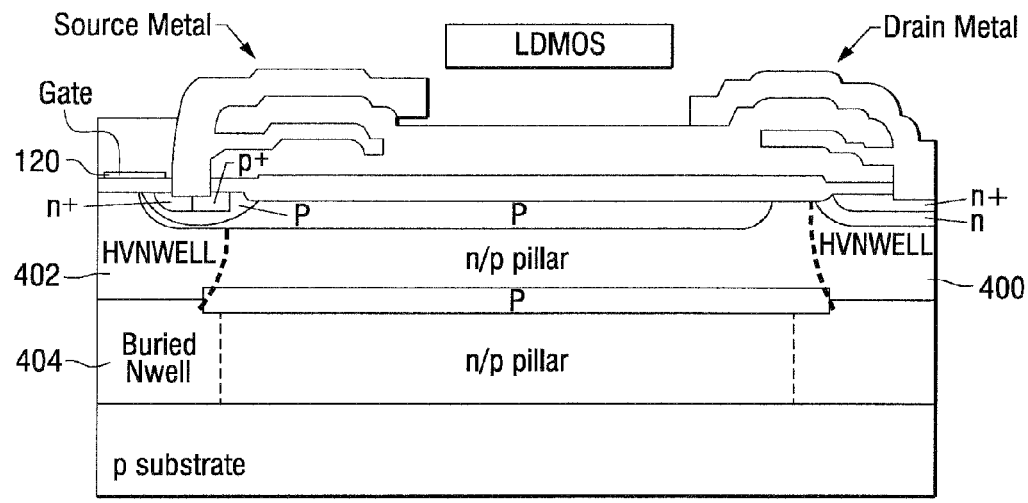
FIGS. 11A and 11B are respective diagrammatic views of other embodiments of the present invention.
Figure 11B:
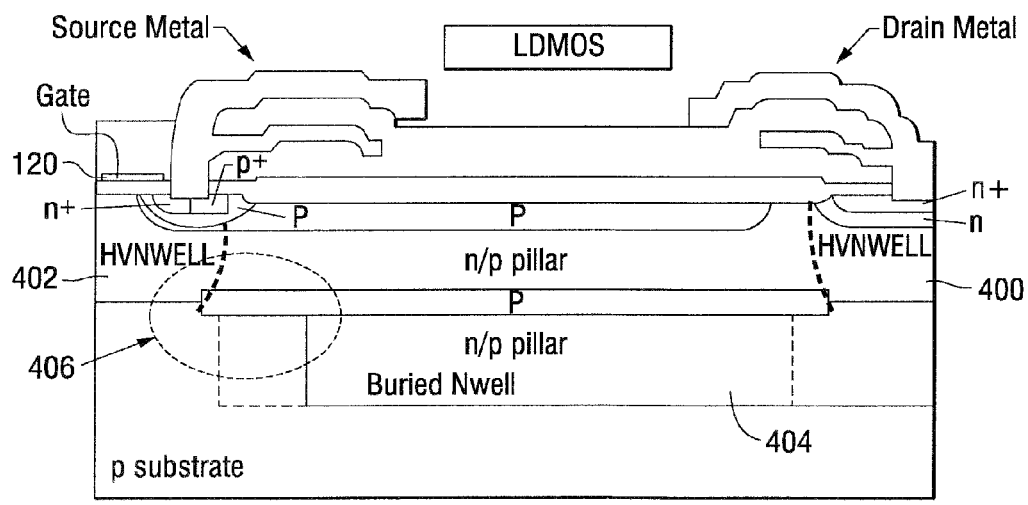

Dual n-type wells are shown in FIG. 11A, one for n-epi (without HVNWELLS 400, 402) or p-epi (with HVNWELLS 400, 402) and the other for buried Nwell 404. Step n-type wells are shown in FIG. 11B, one for n-epi (without HVNWELLS 400, 402) or p-epi (with HVNWELLS 400, 402) and the other for buried Nwell 404. The buried Nwell 404 is undercut 406 in the drift area near the source side. In this way, the n/p pillars near the source side and n-epi. (or HVNWELL) in source area are easily pitched off for high breakdown voltage. However, in the on-state, due to no buried Nwell near the source region, the drift area near the source side becomes small, which will induce a slightly higher on-state resistance.

Figure 12:
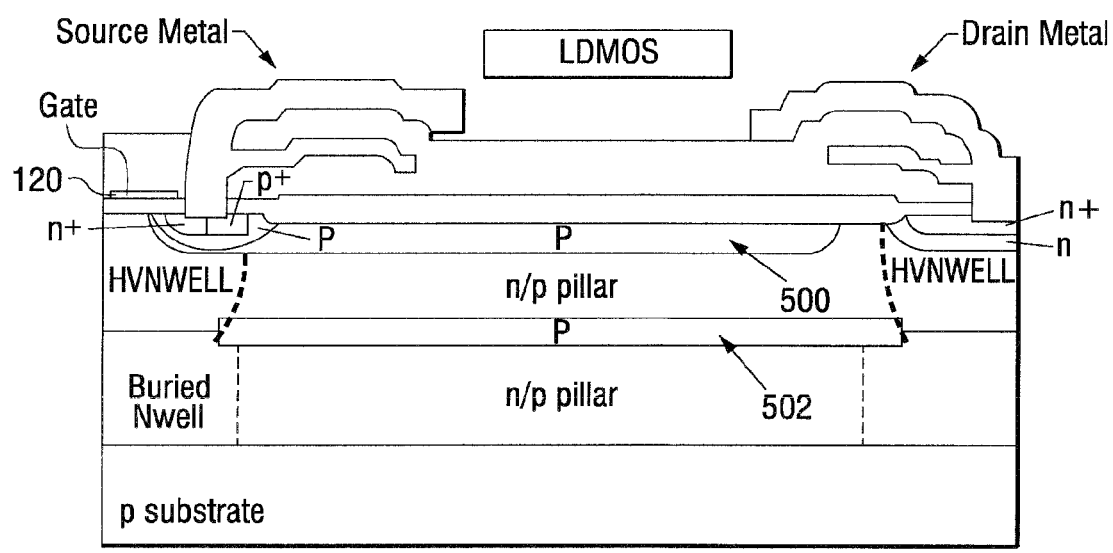
FIG. 12 is a diagrammatic view of another embodiment of the present invention.

FIG. 12 shows a p-type layer 500 on top of the dual n-type wells and an adjustment p-type layer 502 between the top/buried n-type wells.

Figure 13A:
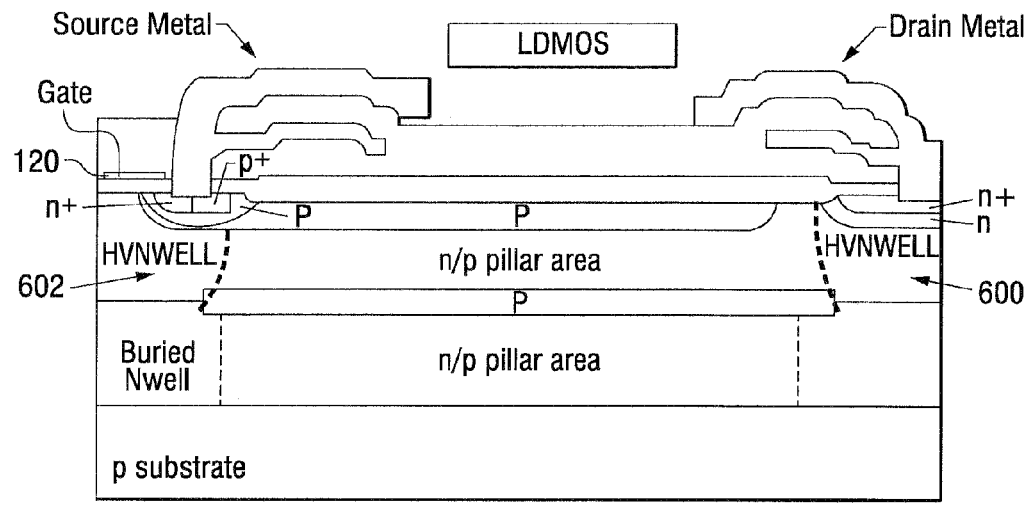
FIGS. 13A and 13B are respective diagrammatic views of other embodiments of the present invention.
Figure 13B:
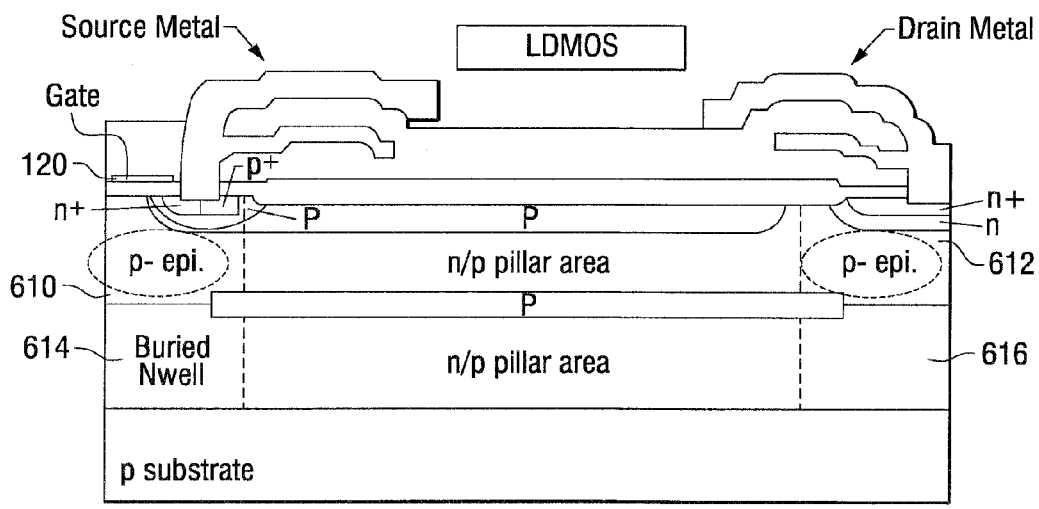

FIG. 13A shows a stacked JFET region linked by an optional n-type well—i.e., HVNWELLS 600 and 602. FIG. 13B shows p-epi regions 610, 612 built on top of buried Nwell regions 614 and 616. Because there is no link-up between n-type drain to n/p pillar area and no link-up between n/p pillar area to the channel region, HVNWELL regions are added to the p-epi regions grown on the top of the buried Nwell regions.

Figure 14A:
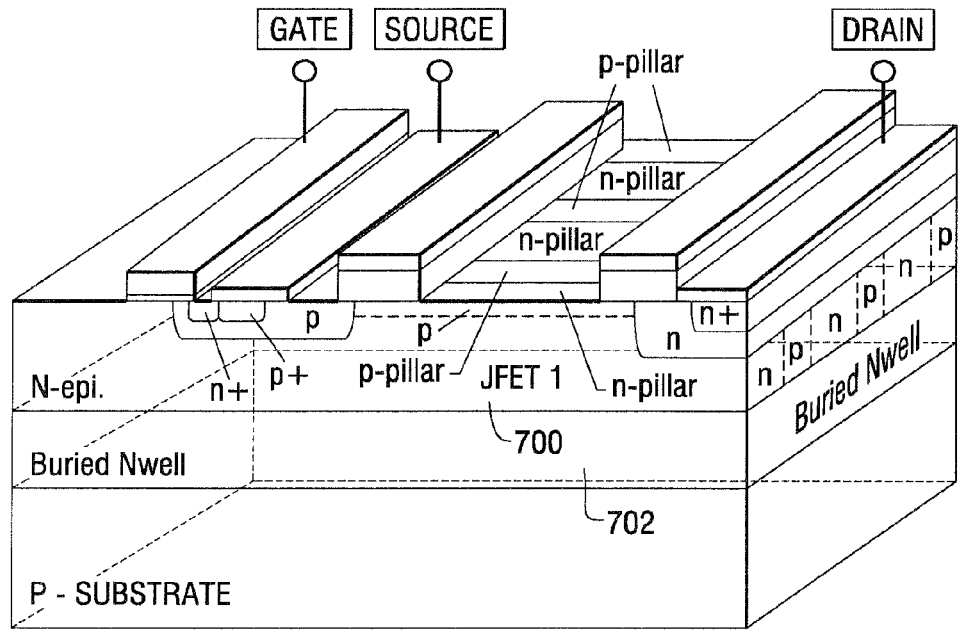
FIGS. 14A and 14B are respective diagrammatic views of other embodiments of the present invention.
Figure 14B:
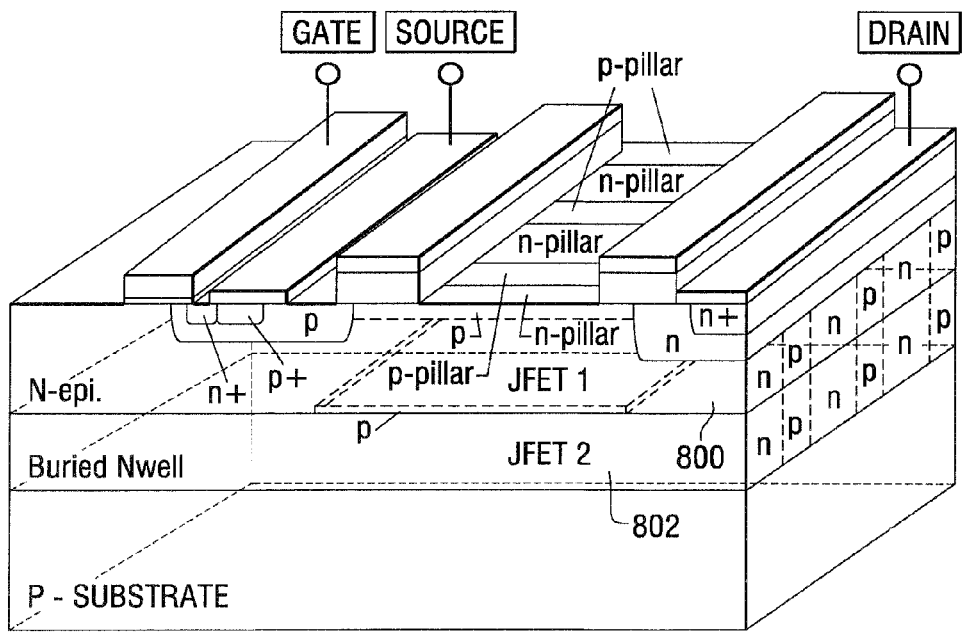

FIG. 14A shows a device with shallow trenches (such as 8 um-12 um) in which there is no JFET2 and JFET1 700 is built on the top of buried Nwell 702. FIG. 14B shows a device with deep trenches (such as 12 um-20 um) in which JFET1 800 is stacked with JFET2 802.

Figure 15A:
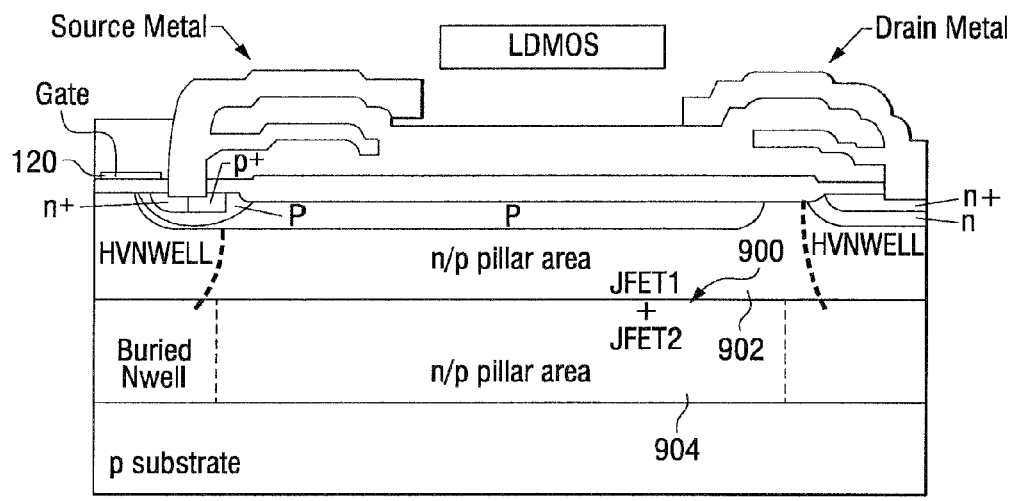
FIGS. 15A-15E are respective diagrammatic views of other embodiments of the present invention.
Figure 15B:
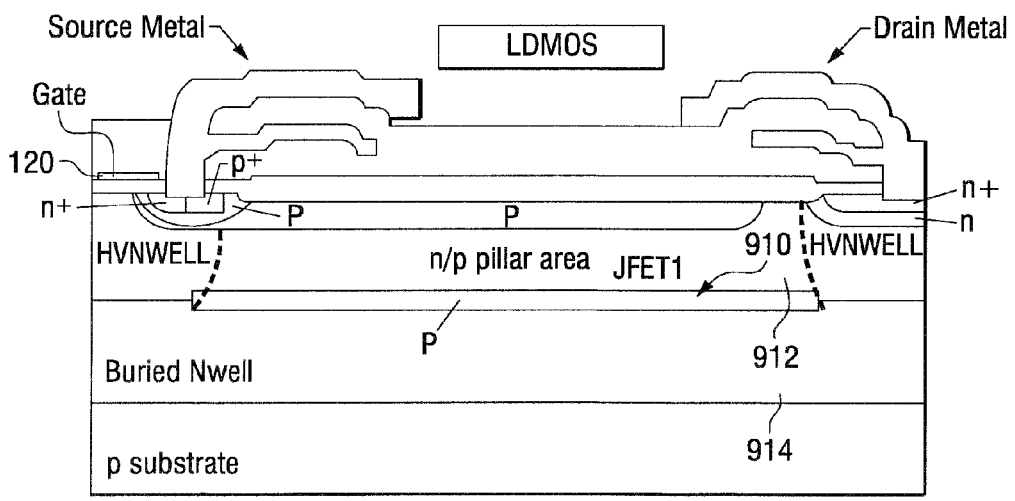
Figure 15C:
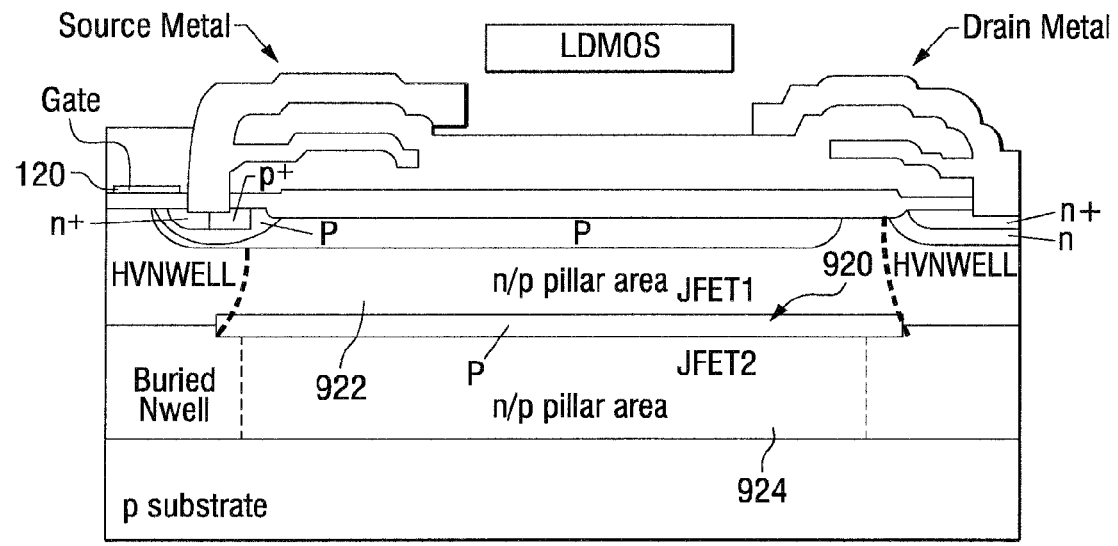
Figure 15D:
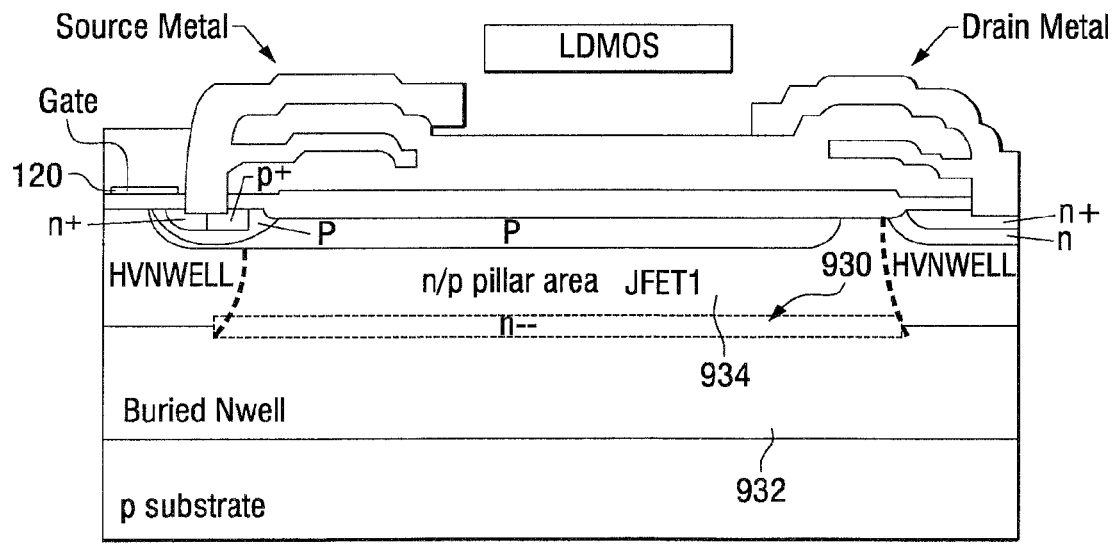
Figure 15E:
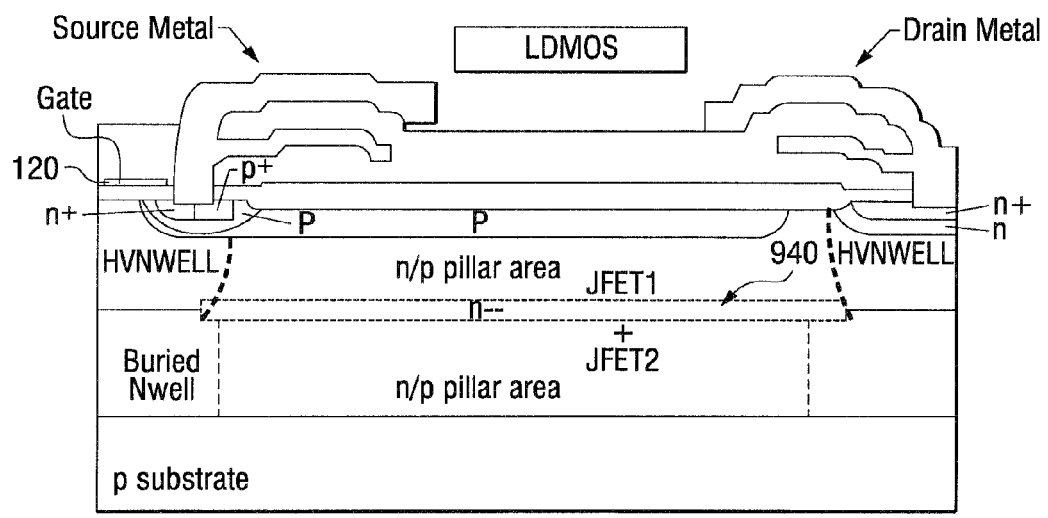

FIGS. 15A-15E show various arrangements without and with various type adjustment layers. FIG. 15A shows no adjustment layer 900 where JFET1 902 and JFET2 904 merge together into a single big JFET. FIG. 15B shows a relatively high p-type adjustment layer 910 with shallow trench option where JFET1 912 is located on the top of buried Nwell 914. FIG. 15C shows a relatively medium p-type adjustment layer 920 with deep trench option where JFET1 922 is stacked with JFET2 924. FIG. 15D shows a relatively low p-type adjustment layer 930 (the p-type doping concentration will be compensated by the top of the buried Nwell 932) with shallow trench option. The top of the buried Nwell 932 doping concentration is reduced due to the compensation, therefore the n pillars on the bottom of JFET1 934 is easily depleted for high breakdown voltage. FIG. 15E shows a relatively low p type adjustment layer 940 (the p-type doping concentration will be compensated by the top of the buried Nwell) with deep trench option. The top of the buried Nwell doping concentration is reduced due to the compensation, and, therefore, the middle area of the n pillars in the big JFET (JFET1 merge to JFET2) is easily depleted for high breakdown voltage.

The invention has the following advantages, among others.

1. The surface electric field of a high voltage LDMOS device can be significantly reduced by the offset gate for high device breakdown voltage. The percentage of channel/source area for high voltage (such as 700V) is very small, especially in advanced technology, with minimum effect for channel/source resistance.

2. A complicated high voltage LDMOS design is changed to a relatively simple high voltage PIN diode design.

3. Resurf (reduced surface E-field) not only comes from the drift region, but also comes from the channel region location in the device of the invention due to drain current flow deeply into the semiconductor bulk, therefore reducing surface electric field in the LDMOS.

4. The off-set gate with p-body (p-well) facing the drain effectively collects hole current at the device on-state for large device safe operating area (SOA).

5. The off-set gate oxide is not located at the p/n pillar areas, therefore, there is no sensitivity for the top topography of the super junction areas and the gate oxide can be very thin and compatible with advanced technology trend.

6. The stacked JFET drift region with 4-depletion (4-D) extensions results in high breakdown voltage of the device.

7. There is a high doping concentration in the (p/n pillar) drift region for super junction purpose with dual current paths for low on resistance.

8. A trench pillar 4-D stacked JFET drift off-set gate high voltage LDMOS can be easily integrated to an advanced technology platform.

Although the invention has been described in detail with particular reference to certain preferred embodiments thereof, it will be understood that variations and modifications can be effected within the spirit and scope of the invention. Thus, the n-drift region of the device can have more or less than two stacked JFETs. Although the invention has been described relating to nmos devices, it is equally applicable to pmos devices.

The invention claimed is:

1. A method of making a lateral DMOS semiconductor device having a drift region comprising:
    providing a semiconductor substrate of a first conductivity type;
    producing a buried well of a second conductivity type in said semiconductor substrate;
    producing a shallow buried layer of a first conductivity type inside said buried well;
    producing a source laterally spaced from a drain;
    producing a drift region with pillars of alternating conductivity between the source and the drain;
    providing at least one junction field effect transistor proximate the drain;
    producing, an epitaxial layer of a second conductivity type on said buried well;
    etching spaced, parallel trenches in said epitaxial layer and buried well; wherein the width of said trenches is equal or less than the width of the width of the regions between said etched trenches; and
    at least partially filling said trenches with material of said first conductivity type, resulting in alternating pillars of said first and second conductivity type.

2. The method of claim 1 wherein said first conductivity type is a p type and second conductivity type is an n type.

3. The method of claim 2 wherein the doping concentration of said p type is equal or greater than the doping concentration of said n type.

4. The method of claim 1 wherein said filling the trenches is by one of oxide/Si, polysilicon, SiC, and high mobility materials such as SiGe.

5. A method of making a semiconductor device having a drift region, comprising:
    providing a semiconductor substrate of a first conductivity type;
    producing a buried well of a second conductivity type in said semiconductor substrate;
    producing a shallow buried layer of a first conductivity type inside said buried well;
    producing an epitaxial layer of a first conductivity type on said buried well;
    producing two wells of a second conductivity type in said epitaxial layer located in source and drain areas;
    producing a source laterally spaced from a drain;
    producing a drift region with pillars of alternating conductivity between the source and the drain;
    providing at least one junction field effect transistor proximate the drain;
    etching spaced, parallel trenches in said epitaxial layer and buried well, wherein the width of said trenches is equal or larger than the width of the width of the regions between said etched trenches; and
    filling said trenches by segment epitaxial refill with material of said second conductivity type, resulting in alternating pillars of said first and second conductivity type; wherein the alternating pillars of said first and second conductivity type are linked with the two wells of said second conductivity type located in said source and drain areas.

6. The method of claim 5 wherein said first conductivity type is a p type and said second conductivity type is an n type.

7. The method of claim 5 wherein the segment epitaxial refill is one of Si, polysilicon, SiC, and high mobility materials such as SiGe.

8. The method of claim 6 wherein said p type has a doping concentration equal or greater than the doping concentration of said n type.

9. A method of making a semiconductor device having a drift region, comprising:
- providing a semiconductor substrate of a first conductivity type;
- producing a buried well of a second conductivity type in said semiconductor substrate;
- producing a shallow buried layer of a first conductivity type inside said buried well;
- producing an epitaxial layer of a first conductivity type on said buried well;
- producing two wells of a second conductivity type in said epitaxial layer located in source and drain areas wherein the source and drain areas are laterally separated from each other;
- producing a drift region with pillars of alternating conductivity;
- providing at least one junction field effect transistor proximate the drain;
- etching spaced, parallel trenches in said epitaxial layer and buried well, wherein the width of said trenches is equal or larger than the width of the width of the regions between said etched trenches;
- filling said trenches by oxide/Si refill in which a trench sidewall thermal oxide layer has a Si of said second conductivity type refill, and the alternating pillars of said first and second conductivity types are linked with the two wells of said second conductivity type located in said source and drain areas.

10. The method of claim 9 wherein filling said trenches is with one of oxide/Si, polysilicon, SiC, and high mobility materials such as SiGe.

11. The method of claim 1 wherein said p type has a doping concentration equal or greater than the doping concentration of said n type.

12. The method of claim 1 wherein said trenches are completely filled with material of said first conductivity type.

13. The method of claim 12 wherein said trenches are filled by epitaxial refill.

14. The method of claim 12 wherein said trenches are filled by segment epitaxial refill.

15. The method of claim 1 wherein said trenches are filled by oxide/Si refill in which a trench side-wall thermal oxide layer has a Si of said first conductivity type refill.

* * * * *